United States Patent
Yang et al.

(10) Patent No.: US 10,164,181 B2
(45) Date of Patent: Dec. 25, 2018

(54) SIDEWALL PROTECTION OF MEMORY CELL

(71) Applicant: TAIWAN SEMICONDUCTOR MANUFACTURING CO., LTD., Hsinchu (TW)

(72) Inventors: Tsung-Hsueh Yang, Taichung (TW); Yuan-Tai Tseng, Hsinchu County (TW); Yi-Jen Tsai, New Taipei (TW); Shih-Chang Liu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/489,863

(22) Filed: Apr. 18, 2017

(65) Prior Publication Data

US 2018/0301624 A1    Oct. 18, 2018

(51) Int. Cl.
*H01L 45/00* (2006.01)
*H01L 43/08* (2006.01)

(52) U.S. Cl.
CPC .............. *H01L 45/12* (2013.01); *H01L 43/08* (2013.01); *H01L 45/146* (2013.01)

(58) Field of Classification Search
CPC ... H01L 45/12; H01L 45/1233; H01L 45/146; H01L 43/08
See application file for complete search history.

(56) References Cited

U.S. PATENT DOCUMENTS

| | | | |
|---|---|---|---|
| 9,647,033 B2* | 5/2017 | Shin | H01L 27/228 |
| 9,818,935 B2* | 11/2017 | Chuang | H01L 43/12 |
| 9,837,603 B1* | 12/2017 | Deshpande | H01L 43/08 |
| 2006/0228853 A1* | 10/2006 | Jeong | B82Y 10/00 438/238 |
| 2012/0068282 A1* | 3/2012 | Matsuoka | G11C 11/161 257/421 |
| 2017/0053965 A1* | 2/2017 | Baek | H01L 27/228 |

* cited by examiner

*Primary Examiner* — Allison Bernstein
(74) *Attorney, Agent, or Firm* — McClure, Qualey & Rodack, LLP (57) ABSTRACT

A memory device includes a bottom electrode, a resistance switching element, a top electrode, a spacer and a conductive feature. The resistance switching element is over the bottom electrode. The top electrode is over the resistance switching electrode. The spacer abuts the resistance switching element. The conductive feature is over the top electrode. The spacer is at least partially between the conductive feature and the top electrode.

20 Claims, 7 Drawing Sheets

SIDEWALL PROTECTION OF MEMORY CELL

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
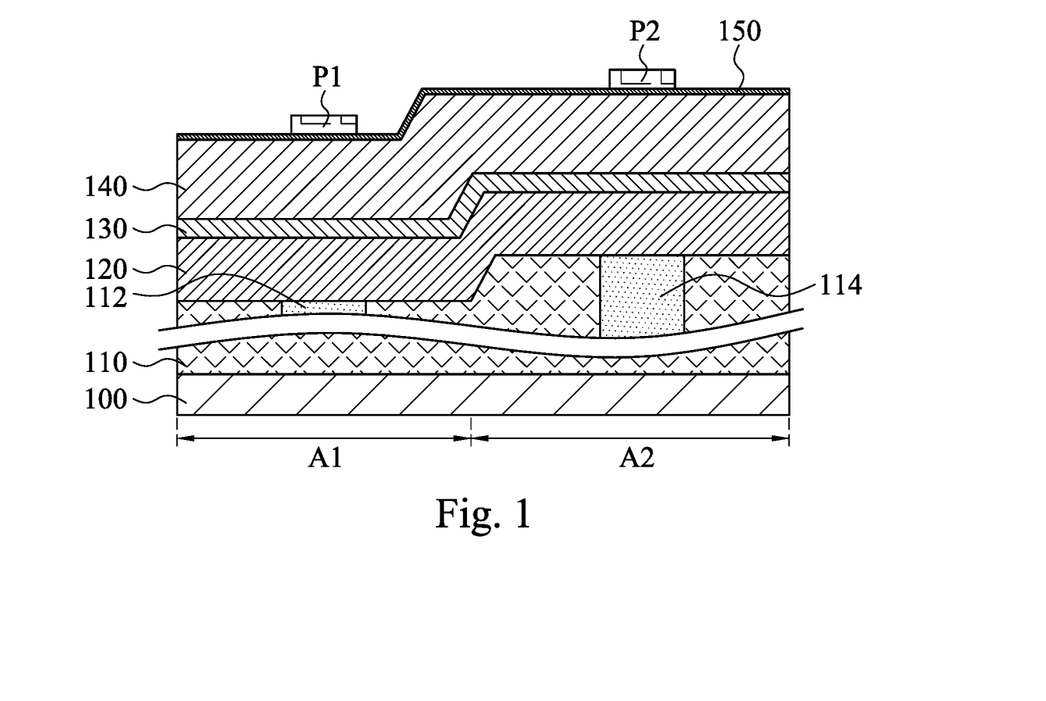
FIGS. 1 through 12 are cross-sectional views of an integrated circuit in various stages of fabrication in accordance with some embodiments of the present disclosure.

FIGS. 1 through 12 illustrate some embodiments to form an integrated circuit with memory cells. FIG. 1 illustrates a wafer having a substrate 100 thereon. The substrate 100 includes an interlayer dielectric (ILD) layer or inter-metal dielectric (IMD) layer 110 with metallization patterns 112 and 114. In some embodiments, the ILD layer 110 may include a first portion A1 and a second portion A2, wherein the second portion A2 has a top surface in a position higher than a top surface of the first portion A1 due to topography of the wafer after fabrication of elements, such as transistors, over the wafer. In other words, the ILD layer 110 over the substrate 100 may include a stepped top surface. The ILD layer 110 may be an extra low-k dielectric (ELK) layer, such as carbon doped silicon dioxide, may be an oxide, such as silicon oxide, and/or may be the like or a combination thereof. In some embodiments, the ILD layer 110 may be formed of a low-k dielectric material having a k value less than about 3.9. The k value of the ILD layer 110 may even be lower than about 2.8. The metallization pattern 112 may be copper, aluminum, the like, and/or a combination thereof. The substrate 100 may also include active and passive devices, for example, underlying the ILD layer 110. These further components are omitted from the figures for clarity, and how these components are formed will be readily apparent to a person having ordinary skill in the art.

A bottom electrode layer 120 is conformally formed over the ILD layer 110. The bottom electrode layer 120 may be formed of conductive materials, such as copper, aluminum, tantalum, tungsten, tantalum nitride (TaN), titanium, titanium nitride (TiN), the like, and/or a combination thereof. In some embodiments, the bottom electrode layer 120 is a multilayered structure. For example, the bottom electrode layer 120 may include a tantalum nitride layer and a titanium nitride layer over the tantalum nitride layer. In some embodiments, the bottom electrode layer 120 has a thickness in a range from about 150 Å to about 350 Å. The bottom electrode layer 120 can be formed using suitable deposition techniques, such as chemical vapor deposition (CVD), physical vapor deposition (PVD), atomic layer deposition (ALD), the like, and/or combinations thereof.

A resistance switching layer 130 is conformally formed over the bottom electrode layer 120. The resistance switching layer 130 can be formed using suitable deposition techniques, such as CVD, PVD, ALD, the like, and/or combinations thereof. In some embodiments, the resistance switching layer 130 may include a magnetic tunnel junction (MTJ) structure including various layers formed of different combinations of materials. In some exemplary embodiments where the resistance switching layer 130 includes the MTJ structure, it may include a pinning layer, a tunnel barrier layer, and a free layer. In addition, the MTJ structure may have other variations including other layers, such as anti-ferro-magnetic layers. In some embodiments, the pinning layer is formed of PtMn, the tunnel barrier layer is formed of MgO, and free layer is formed of CoFeB. The magnetic moment of the free layer may be programmed causing the resistance of the resulting MTJ cell to be changed between a high resistance and a low resistance.

In some embodiments where resistive random access memory (RRAM) cells are to be formed on the wafer, the resistance switching layer 130 may include a RRAM dielectric layer such as metal oxide composite, such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$) as in its relative high resistance state and a metal such as titanium (Ti), hafnium (Hf), platinum (Pt), ruthenium (Ru), and/or aluminum (Al) as in its relative low resistance state.

A top electrode layer 140 is conformally formed over the resistance switching layer 130. The top electrode layer 140 can be formed using suitable deposition techniques, such as CVD, PVD, ALD, the like, and/or combinations thereof. In some embodiments, the top electrode layer 140 may be formed of conductive materials, such as copper, aluminum, tantalum, tungsten, tantalum nitride (TaN), titanium, titanium nitride (TiN), the like, and/or a combination thereof.

A Photoresist is then formed over the top electrode layer 140 and patterned to form photoresist masks P1 and P2 respectively over the first and second portions A1 and A2. Optionally, a bottom anti-reflective coating (BARC) 150, such as organic ARC or inorganic ARC, may be formed underlying the photoresist masks P1 and P2. The BARC 150 may be formed of silicon oxynitride, silicon rich oxide, nitrogen-free ARC materials including SiOC, or combinations thereof.

Figure 2:
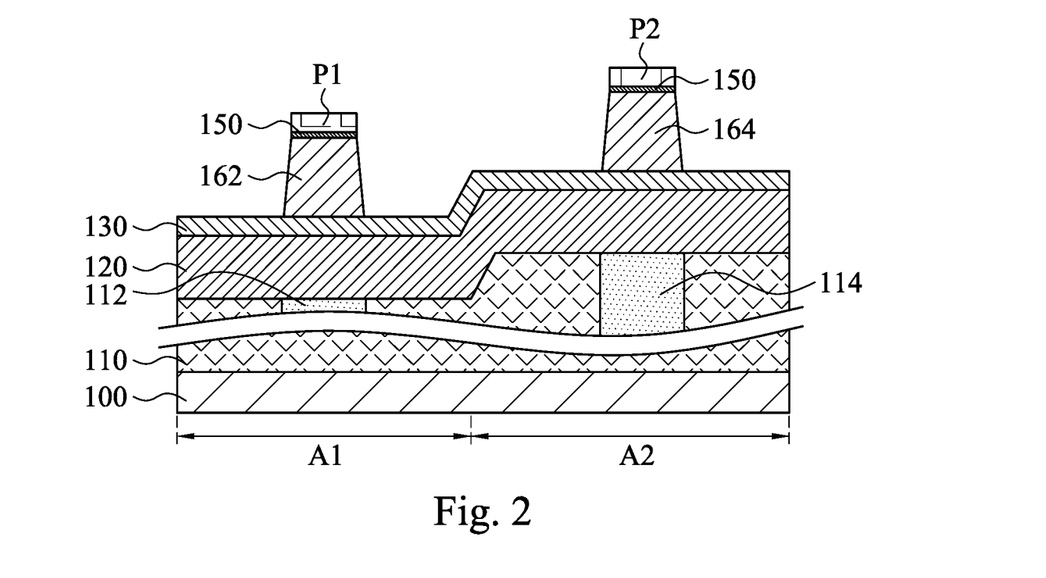
Figure 3:
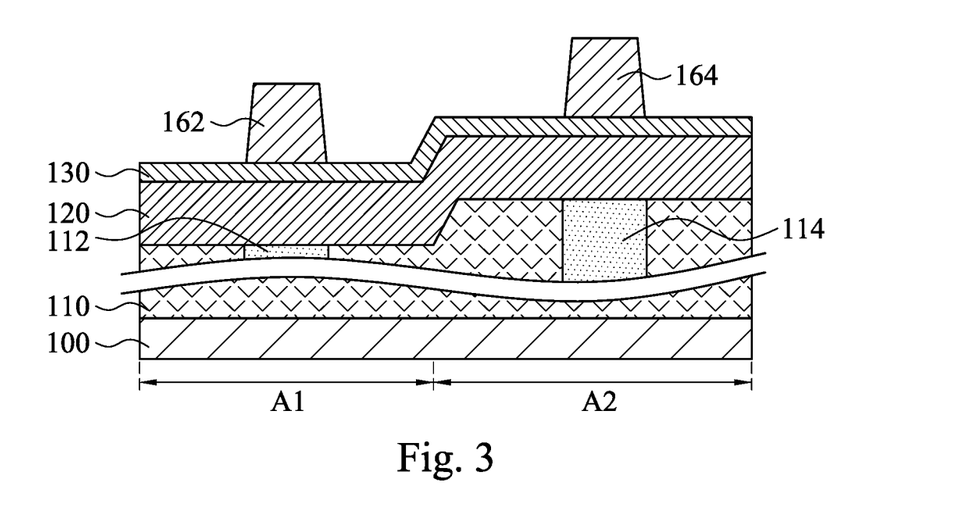

Reference is made to FIG. 2. The BARC 150 and the top electrode layer 140 are then etched, and hence forming top electrodes 162 and 164 respectively over the first and second portions A1 and A2. The top electrodes 162 and 164 may be used as hard masks for the patterning of the underlying layers in some embodiments. In some embodiments where the top electrode layer 140 is formed of tantalum, the etchant may include halogen-containing compound such as $CF_4$. Next, an ashing is performed to remove the photoresist masks P1, P2 and the BARC 150. The resulting structure is shown in FIG. 3. In some embodiments, the ashing process is performed using oxygen-containing gases. In other embodiments, the ashing process is performed using oxygen-free process gases such as a combined gas of nitrogen and hydrogen. Advantageously, with oxygen-free process gases, oxidation of the free layer of the resistance switching layer 130 can be prevented.

Figure 4:
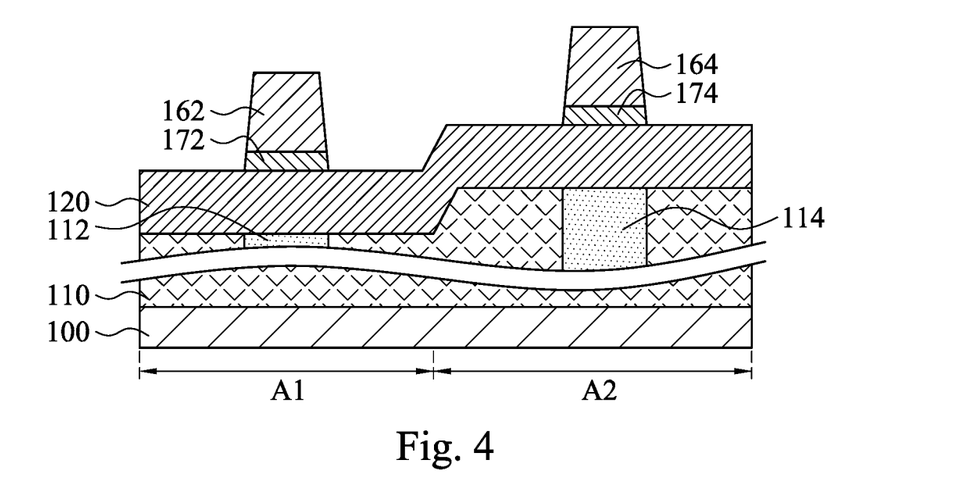

Reference is made to FIG. 4. The resistance switching layer 130 is then patterned using a patterned ARC layer (not shown) or top electrodes 162 and 164 as hard masks. In some embodiments, the steps of etching top electrode layer 140 and etching the resistance switching layer 130 are referred to as "in-situ" performed to indicate that no vacuum-break occurs between these two steps. In some embodiments, the etchant includes alkanols, such as methanol ($CH_3OH$), ethanol, and butanol, or a carbon oxide(s) combined with an ammonia-containing compound(s) (e.g. $CO+NH_3$). Correspondingly, as shown in FIG. 4, remaining portions of the resistance switching layer 130 form resistance switching elements 172 and 174 respectively over the first and second portions A1 and A2.

Figure 5:
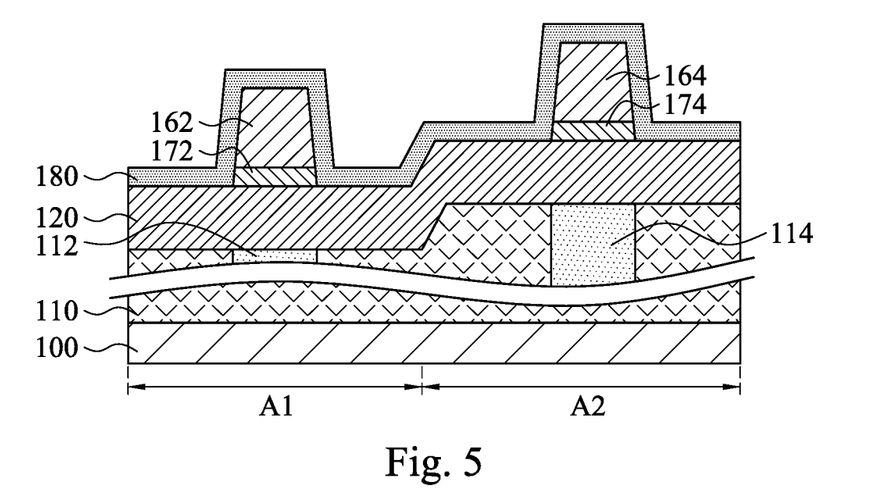

Reference is made to FIG. 5. A spacer layer 180 is blanket formed over the bottom electrode layer 120, over sidewalls of the resistance switching elements 172, 174 and the top electrodes 162, 164, and over top surfaces of the top electrodes 162 and 164. In some embodiments, the steps of etching the resistance switching layer 130 and forming spacer layer 180 are referred to as "in-situ" performed to indicate that no vacuum-break occurs between these two steps. The term "in-situ" may also indicate that between the steps of etching the resistance switching layer 130 and forming the spacer layer 180, the wafer is exposed to environments containing significant lower levels of oxygen, moisture, than in the open air, even though the wafer may be exposed to pressures up to a standard atmosphere. In some embodiments, the weight percentages of oxygen and moisture levels in the environments are less than about 10 percent the respective weight percentages of the oxygen and moisture in open air. In the case no vacuum break occurs between the steps of etching the resistance switching layer 130 and forming the spacer layer 180, the partial pressure of oxygen, moisture, and the like can be less than about 15 Torr, or less than about $10^{-3}$ Torr, or even less than about $10^{-5}$ Torr. The spacer layer 180 may include suitable dielectric materials such as silicon nitride, silicon carbide, carbon-doped silicon nitride, carbon-doped silicon oxide, silicon oxynitride, and combinations thereof. In some embodiments, the spacer layer 180 may also be a composite layer including two or more layers made of different materials, such as a silicon nitride/silicon carbide stack. The spacer layer 180 may be formed using CVD, PVD, ALD, the like, and/or combinations thereof.

Figure 6:
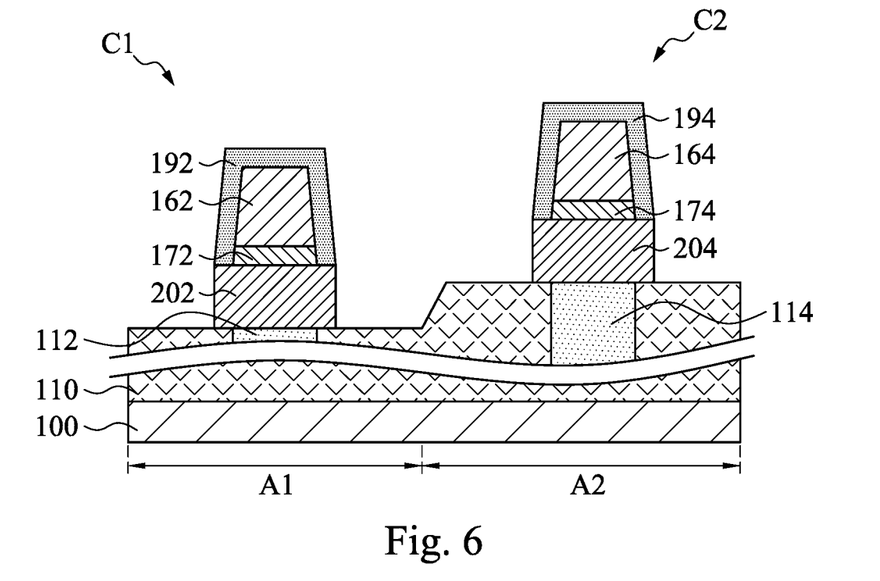

FIG. 6 illustrates patterning of the spacer layer 180 and the bottom electrode layer 120. A remaining portion of the spacer layer 180 covers sidewalls of the resistance switching element 172 and the top electrode 162 and a top surface of the top electrode 162, and it can be referred to as a patterned spacer layer 192 over the first portion A1. A remaining portion of the spacer layer 180 covers sidewalls of the resistance switching element 174 and the top electrode 164 and a top surface of the top electrode 164, and it can be referred to as a patterned spacer layer 194 over the second portion A2. The patterned spacer layers 192 and 194 are separated due to the patterning process. In some embodiments, the patterning of the spacer layer 180 may include an etch process, such as an anisotropic etch using acceptable photolithography techniques.

Thereafter, the bottom electrode layer 120 is patterned to form bottom electrodes 202 and 204 respectively over the first and second portions A1 and A2. The bottom electrode 202 is in contact with the metallization pattern 112 over the first portion A1, and the bottom electrode 204 is in contact with the metallization pattern 114 over the second portion A2. The bottom electrode layer 120 can be patterned according to an additional mask layer overlying the top electrodes 162 and 164. In some embodiments, the patterning process may include one or more etching operations, such as dry etching, wet etching or a combination thereof. In some embodiments, the patterning process may include a dry etching using etchant having gases including $CF_4$, $CH_2F_2$, $Cl_2$, $BCl_3$ and/or other chemicals, as example.

The bottom electrode 202, the resistance switching element 172 over the bottom electrode 202, and the top electrode 162 over the resistance switching element 172 can be in combination referred to as a memory cell C1 over the first portion A1. Similarly, the bottom electrode 204, the resistance switching element 174 over the bottom electrode 204, and the top electrode 164 over the resistance switching element 174 can be in combination referred to as a memory cell C2 over the second portion A2. Because the top surface of the second portion A2 is in a position higher than the top surface of the first portion A1, a top of the memory cell C2 is in a position higher than a top of the memory cell C1.

Figure 7:
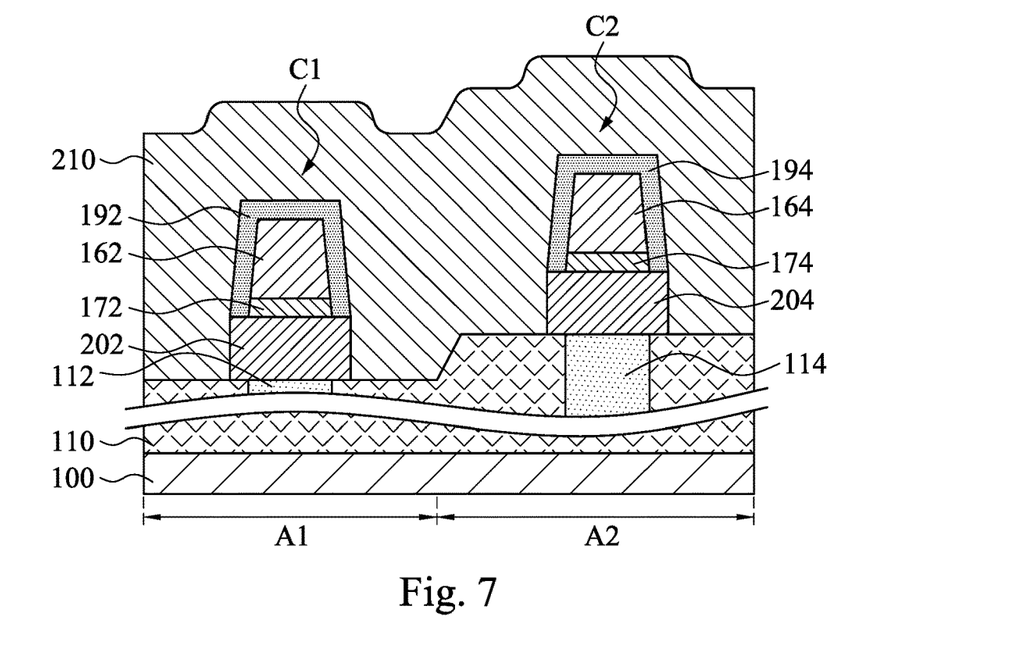
Figure 8:
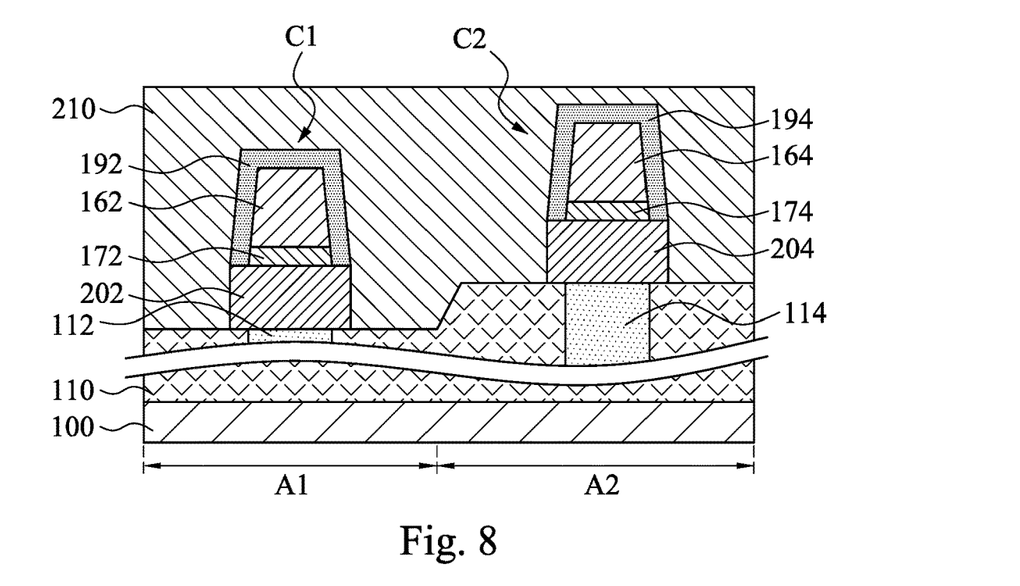

Reference is made to FIG. 7. A dielectric layer 210, which may be an oxide layer including, for example, carbon-containing silicon oxide, fluorine-containing silicon oxide, silicon carbide, or a low-k dielectric material having a dielectric constant less than about 3.2 (such as polyimide and the like) used for forming interlayer or inter-metal dielectrics, is deposited over the patterned spacer layers 192 and 194, and the gaps between memory cells C1 and C2 are fully filled. The dielectric layer 210 may be formed of a material different from that of patterned spacer layers 192 and 194. The dielectric layer 210 may have an uneven top surface due to the topography of the wafer, and hence a planarization process, such as a chemical mechanical polish (CMP), is performed to planarize the top surface. The resulting structure is shown in FIG. 8.

Figure 9:
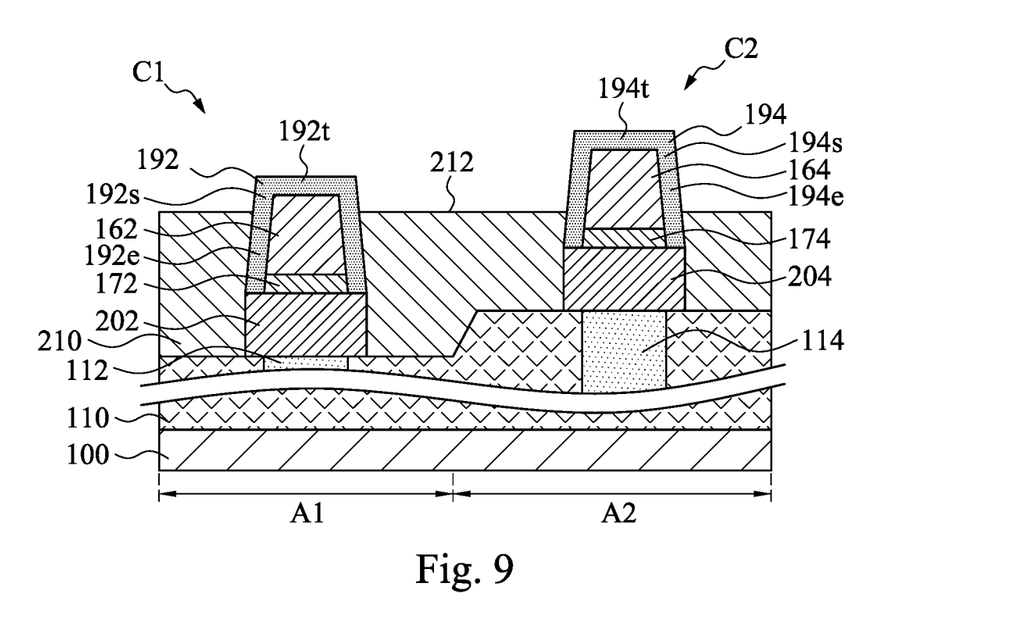

Thereafter, the planarized dielectric layer 210 is etched back to reach a level lower than top surfaces of top electrodes 162 and 164 of memory cells C1 and C2. The resulting structure is shown in FIG. 9. In some embodiments where the memory cell C2 is in a position higher than the memory cell C1 due to the topography of the wafer, the etching back process may reach a level of the resistance switching element 174 of the higher memory cell C2, and hence the resistance switching element 174 may be exposed if the spacer layer 194 is removed by the etching back process. Such exposure of the resistance switching element 174 is undesirable because conductive materials deposited in a subsequent process would be in contact with the exposed resistance switching element 174, and such a contact would create an unwanted electrical connection to the resistance switching element 174. Moreover, the exposed resistance switching element 174 may be damaged by the etching back process.

Therefore, the dielectric layer 210 is selected to have an etch resistance property different from an etch resistance property of the spacer layers 192 and 194. Specifically, the spacer layers 192 and 194 have higher etch resistance to the etching back process than that of the dielectric layer 210. In other words, the spacer layers 192 and 194 have higher etch resistance to the etchant used to etch back the dielectric layer 210. That is to say, an etch rate of the dielectric layer 210 is greater than etch rates of the spacer layers 192 and 194 during the etching back of the dielectric layer 210. Therefore, the spacer layer 194 can still remain covering the resistance switching element 174 of the higher memory cell C2, and the spacer layer 192 can still remain covering the resistance switching element 172 of the lower memory cell C1 as well. Therefore, even if the topography of the wafer causes height differences between the memory cells C1 and C2, the resistance switching elements 172 and 174 of the memory cells C1 and C2 will not be exposed after the etching back of the dielectric layer 210, and hence unwanted electrical connections from subsequently deposited conductive materials to the resistance switching elements 172 and 174 can be prevented. Moreover, the damage risk on the resistance switching elements 172 and 174 can be prevented because of protection of the spacer layers 192 and 194.

In some embodiments, the dielectric layer 210 is made of silicon oxide, and the spacer layers 192 and 194 are made of silicon nitride or silicon carbide. The etching back of the dielectric layer 210 may be selective to silicon oxide (not selective to silicon nitride or carbide). The etching back of the dielectric layer 210 may be dry etching, wet etching, or a combination thereof. For example, the etching back of the dielectric layer 210 may be dry etching, such as reactive ion etching (RIE), plasma enhanced (PE) etching, or inductively coupled plasma (ICP) etching. In some embodiments, fluorine-based RIE can be used to etch back the dielectric layer 210. The gas etchant used to etch back the dielectric layer 210 is, for example, $CF_4/O_2$, $ClF_3$, $CCl_3F_5$, $SF_4/O_2$, or combinations thereof. In some embodiments, the etching back of the dielectric layer 210 may be wet etching using an etchant such as dilute hydrofluoric acid (DHF).

In some embodiments, because the spacer layers 192 and 194, respectively covering the lower and higher memory cells C1 and C2, remain unremoved after the etching back of the dielectric layer 210, the spacer layers 192 and 194 have portions protruding from a top surface 212 of the dielectric layer 210. For example, the spacer layer 192 has a sidewall portion 192s on a sidewall of the lower memory cell C1 and a cap portion 192t over a top surface of the lower memory cell C1. Similarly, the spacer layer 194 has a sidewall portion 194s on a sidewall of the higher memory cell C2 and a cap portion 194t over a top surface of the higher memory cell C2. The sidewall portions 192s, 194s and the cap portions 192t, 194t are exposed after the etching back of the dielectric layer 210. The sidewall portion 192s protects sidewalls of the top electrode 162 and the resistance switching elements 172, and the cap portion 192t protects the top surface of the top electrode 162. Similarly, the sidewall portion 194s protects sidewalls of the top electrode 164 and the resistance switching elements 174, and the cap portion 194t protects the top surface of the top electrode 164. In some embodiments, the spacer layers 192 and 194 include embedded portions 192e and 194e that remain embedded in the dielectric layer 210 after the etching back process. In other words, the embedded portions 192e and 194e are not attacked by the etchant used in the etching back process. Because the sidewall portions 192s, 194s and the cap portions 192t, 194t may be attacked by the etchant used in the etching back process, the sidewall portions 192s, 194s and the cap portions 192t, 194t are thinner than the embedded portions 192e and 194e in some embodiments.

Figure 10:
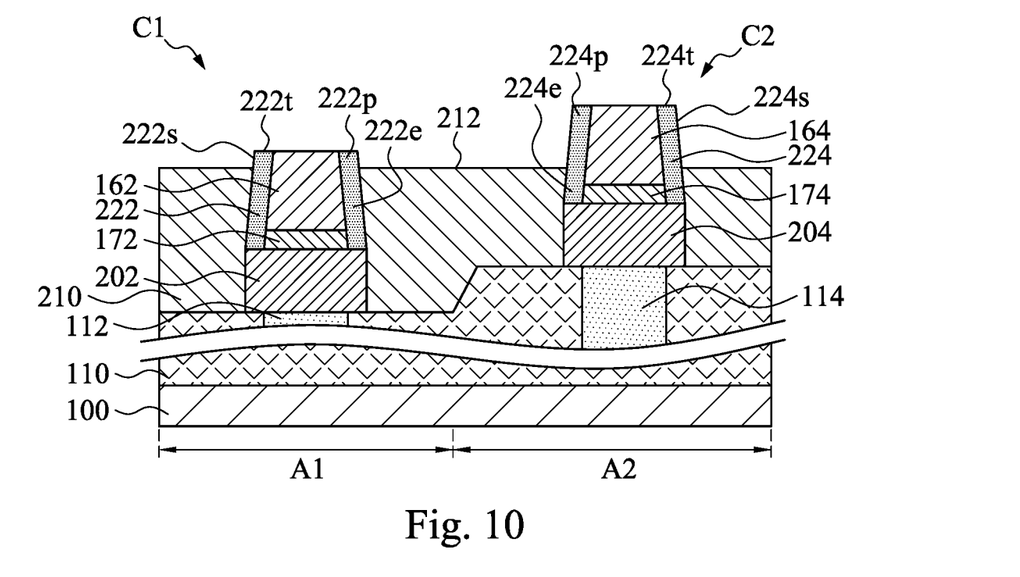

Next, cap portions 192t and 194t over the top electrodes 162 and 164 are removed, and the remaining portions of the spacer layers 192 and 194 form spacers 222 and 224 on sidewalls of the memory cells C1 and C2. The removal process may be dry etching, wet etching, or a combination thereof. The removal process may be an anisotropic etching process in some embodiments. In some embodiments where spacer layers 192 and 194 include silicon nitride, an exemplary method of removing the cap portions 192t and 194t may be wet etching which is able to selectively remove silicon nitride, and this wet etching utilizes hot (approximately 145° C.-180° C.) phosphoric acid ($H_3PO_4$) solutions with water, as examples. In some embodiments, the etching process of the cap portions 192t and 194t also removes portions of the sidewall portions 192s and 194s, and the remaining sidewalls portions 192s and 194s can be referred to as the spacers 222 and 224.

As shown in FIG. 10, the dielectric layer 210 can be referred to as a dielectric feature between the memory cells C1 and C2 in some embodiments. The dielectric layer 210 abuts sidewalls 222s and 224s of the spacers 222 and 224. The spacers 222 and 224 protrude from the top surface 212 of the dielectric layer 210. Stated differently, the top surface 212 (or top) of the dielectric layer 210 is in a position lower than top surfaces 222t and 224t (or tops) of the spacers 222 and 224. Specifically, the spacer 222 includes an embedded portion 222e embedded in the dielectric layer 210 and a protruding portion 222p over the embedded portion 222e. The protruding portion 222p protrudes from the top surface 212 of the dielectric layer 210. Because the embedded portion 222e is not attacked by the etchant used in etching back of the dielectric layer 210 and the etchant used in removing the cap portions 192t and 194t (shown in FIG. 9), but the protruding portion 222p is attacked by these etchants, the embedded portion 222e may be thicker than the protruding portion 222p in some embodiments. Similarly, the spacer 224 includes an embedded portion 224e embedded in the dielectric layer 210 and a protruding portion 224p protruding from the top surface 212 of the dielectric layer 210, and the embedded portion 224e may be thicker than the protruding portion 224p in some embodiments.

Figure 11:
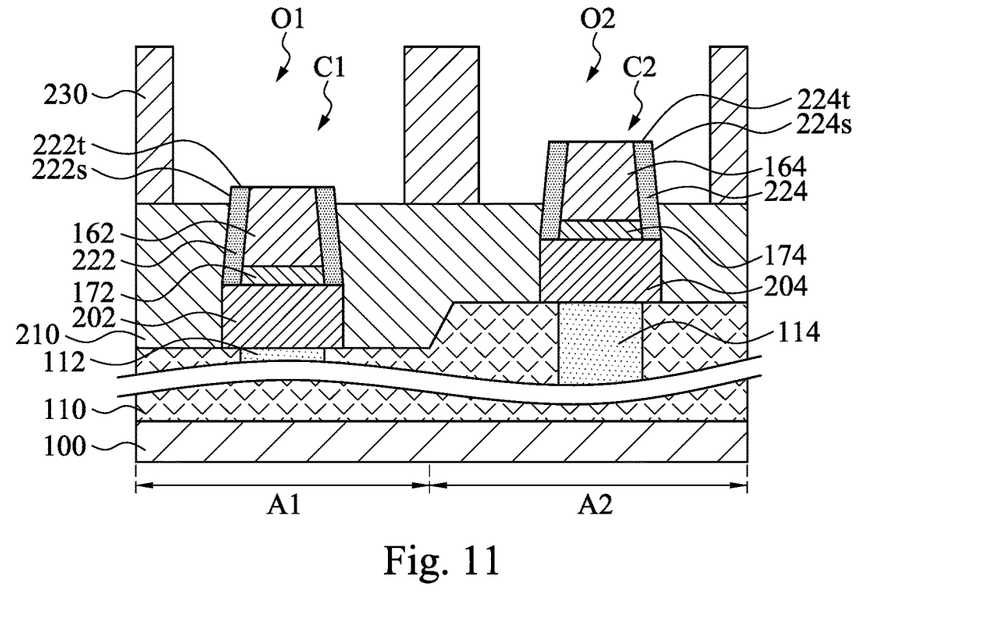

Reference is made to FIG. 11. Another ILD layer 230 is blanket formed over the memory cells C1, C2, the spacers 222, 224 and the dielectric layer 210, and openings O1 and O2 are then etched in the ILD layer 230 to expose top electrodes 162 and 164 of the memory cells C1 and C2. Because the spacers 222 and 224 respectively abut the resistance switching elements 172 and 174, the resistance switching elements 172 and 174 can be protected from etching of the openings O1 and O2 at least by the spacers 222 and 224. Moreover, the resistance switching elements 172 and 174 can be separated from the conductive features, subsequently formed in the openings O1 and O2, at least by the spacers 222 and 224. Therefore, process windows of the openings O1 and O2 used for forming the conductive features over the top electrodes 162 and 164 can be improved. In some embodiments, top surfaces 222t and 224t of the spacers 222 and 224 are exposed in the openings O1 and O2, respectively. In further embodiments, sidewalls 222s and 224s of the spacers 222 and 224 are respectively exposed in the openings O1 and O2 as well. In further embodiments, the top surface 212 of the dielectric layer 210 is exposed in the openings O1 and O2. That is to say, the opening O1 is wider than the memory cell C1 and thus exposes the spacer 222 and the dielectric layer 210 around the memory cell C1. Similarly, the opening O2 is wider than a memory cell C2 and thus exposes the spacer 224 and the dielectric layer 210 around the memory cell C2.

In some embodiments, the ILD layer 230 may have the same material as the underlying ILD layer 110. The ILD layer 230 may be an extra low-k dielectric (ELK) layer, such as carbon doped silicon dioxide, may be an oxide, such as silicon oxide, and/or may be the like or a combination thereof. In some embodiments, the ILD layer 230 may be formed of a low-k dielectric material having a k value less than about 3.9. The k value of ILD layer 230 may even be lower than about 2.8. Formation of the ILD layer 230 may be exemplarily performed using CVD, PECVD, PVD, the like, and/or combinations thereof. In some embodiments, an optional etch stop layer (not shown) is formed over the structure shown in FIG. 10, and the ILD layer 230 is then formed over the etch stop layer. The openings O1 and O2 are formed by etching through the ILD layer 230 and the etch stop layer.

Figure 12:
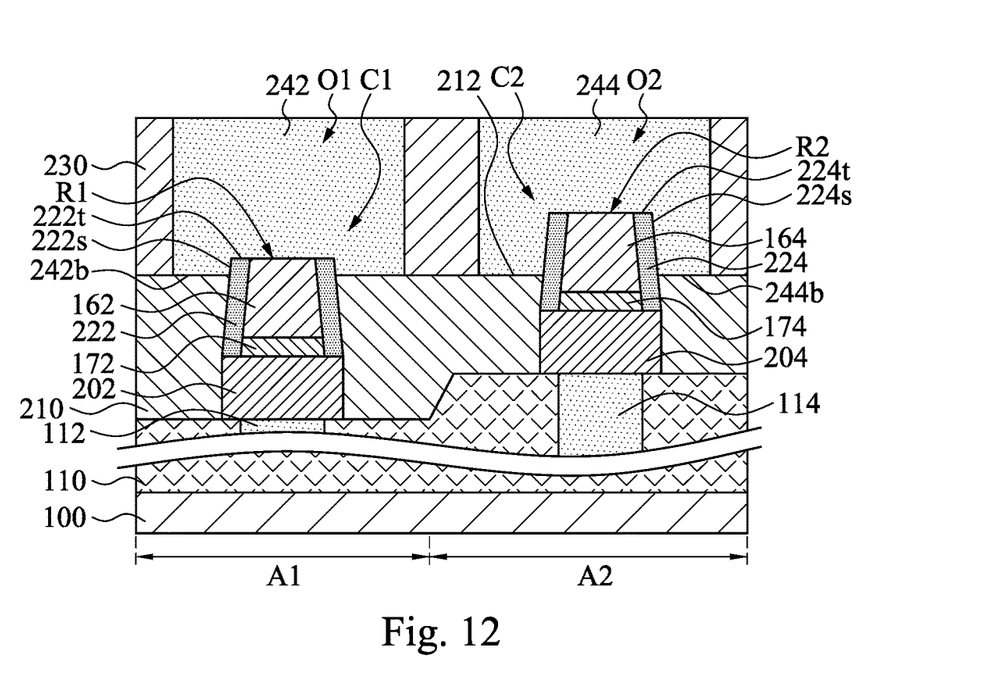

The openings O1 and O2 are then filled with a conductive material, such as metal, to form conductive features 242 and 244 over the top electrodes 162 and 164, as shown in FIG. 12. The filling may also include one or more liner and barrier layers in additional a metal conductor. The liner and/or barrier may be conductive and deposited using CVD or PVD. The metal may be deposited using PVD or one of the plating methods, such as electrochemical plating. A planarization process, such as a CMP process, is then performed to planarize the conductive features 242, 244 and the ILD layer 230.

As illustrated in FIG. 12, since the spacer 222 abutting the top electrode 162 is exposed in the opening O1, the spacer 222 is at least partially between the conductive feature 242 and the top electrode 162 after filling the opening O1. In further embodiments, portions of the top electrode 162 and the spacer 222 protrude from the top surface 212 of the dielectric layer 210, and hence these portions of the top electrode 162 and the spacer 222 fill a recess R1 of the conductive feature 242 after the deposition of the conductive feature 242. Stated differently, these portions of the top electrode 162 and the spacer 222 are embedded in the conductive feature 242. That is to say, the spacer 222 extends into the recess R1 of the conductive feature 242. In other words, a bottom surface 242b (or bottom) of the conductive feature 242 is in a position lower than the top surface 222t (or top) of the spacer 222. In further embodiments, the conductive feature 242 forms an interface with the dielectric layer 210, and this interface is in a position lower than the top surface 222t of the spacer 222. In some embodiments where the spacer 222 is partially embedded in the dielectric layer 210, the sidewall 222s of the spacer 222 extends along the conductive feature 242 and the dielectric layer 210. Specifically, an upper portion of the sidewall 222s of the spacer 222 is in contact with a surface of the recess R1 of the conductive feature 242, and a lower portion of the sidewall 222s of the spacer 222 is in contact with the dielectric layer 210.

Similarly, the spacer 224 is at least partially between the conductive feature 244 and the top electrode 164. In further embodiments, portions of the top electrode 162 and the spacer 222 fill a recess R2 of the conductive feature 244 after the deposition of the conductive feature 244. Stated differently, these portions of the top electrode 164 and the spacer 224 are embedded in the conductive feature 244. That is to say, the spacer 224 extends into the recess R2 of the conductive feature 244. In other words, a bottom surface 244b (or bottom) of the conductive feature 244 is in a position lower than the top surface 224t (or top) of the spacer 224. In further embodiments, the conductive feature 244 forms an interface with the dielectric layer 210, and this interface is in a position lower than the top surface 224t of the spacer 224. The sidewall 224s of the spacer 224 extends along the conductive feature 244 and the dielectric layer 210.

Due to a height difference between the memory cells C1 and C2, the top surfaces 222t and 224t of the spacers 222 and 224 are at different heights. In some embodiments, a distance between the top surface 222t of the spacer 222 and the top surface 212 of the dielectric layer 210 is different from a distance between the top surface 224t of the spacer 224 and the top surface 212. For example, in some embodiments where the spacer 224 is in a position higher than the spacer 222, the distance between the top surface 222t of the spacer 222 and the dielectric layer 210 is less than a distance between the top surface 224t of the spacer 224 and the dielectric layer 210. In some embodiments, a distance between the bottom surface 242b of the conductive feature 242 and the top surface 222t of the spacer 222 is different from a distance between the bottom surface 244b of the conductive feature 244 and the top surface 224t of the spacer 224. For example, the distance between the bottom surface 242b of the conductive feature 242 and the top surface 222t of the spacer 222 is less than the distance between the bottom surface 244b of the conductive feature 244 and the top surface 224t of the spacer 224.

Figure 13:
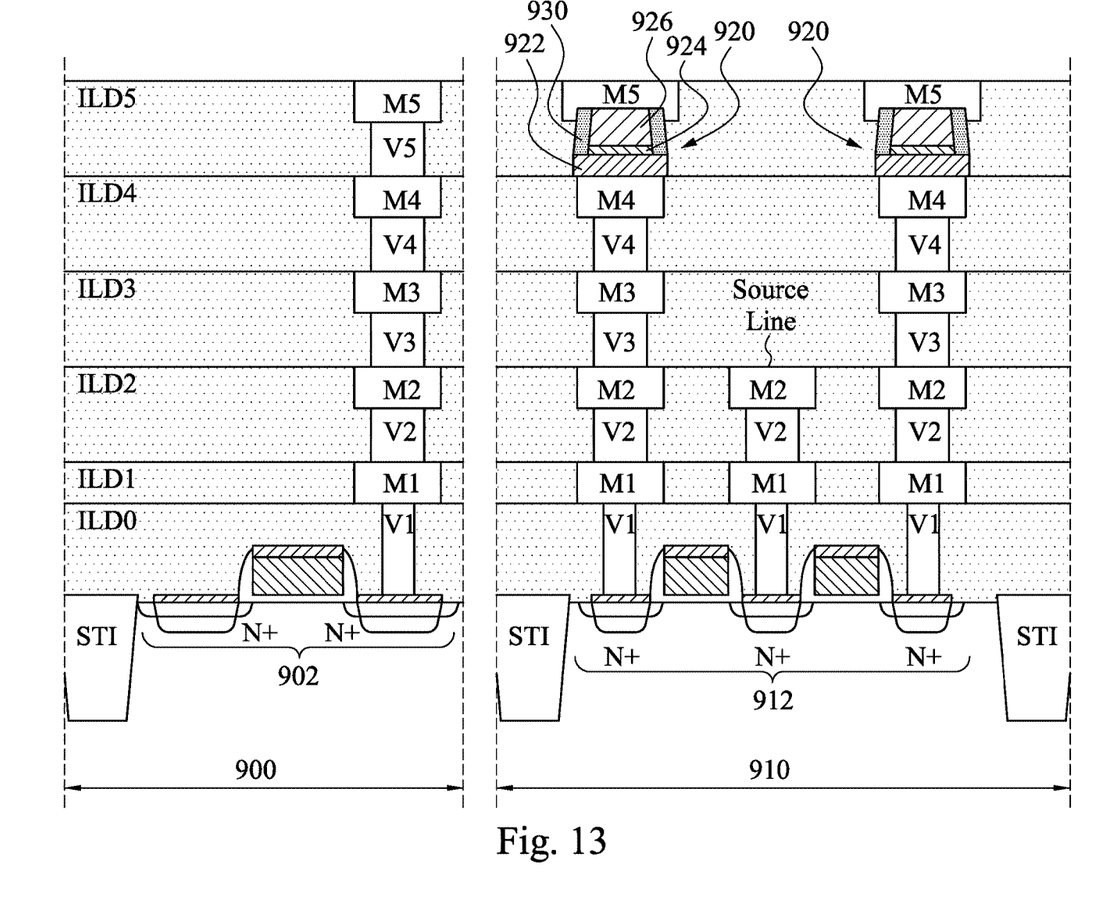
FIG. 13 is a cross-sectional view of an integrated circuit in accordance with some embodiments of the present disclosure.

FIG. 13 illustrates an integrated circuit in accordance with some embodiments. The integrated circuit includes a logic region 900 and a memory region 910. The logic region 900 may include circuitry, such as an exemplary logic transistor 902, for processing information received from memory cells 920 in the memory region 910 and for controlling reading and writing functions of memory cells 920. In some embodiments, the memory cell 920 may include a bottom electrode 922 and a top electrode 926, with a resistance switching element 924 sandwiched in between the bottom and top electrodes 922 and 926. Spacers 930 abut sidewalls of the memory cells 920, respectively. For example, the sidewalls of the top electrode 926 and the resistance switching element 924 are in contact with the spacer 930.

As depicted, an exemplary integrated circuit is fabricated using five metallization layers, labeled as M1 through M5, with five layers of metallization vias or interconnects, labeled as V1 through V5. Other embodiments may contain more or fewer metallization layers and a corresponding more or fewer number of vias. Logic region 900 includes a full metallization stack, including a portion of each of metallization layers M1-M5 connected by interconnects V2-V5, with V1 connecting the stack to a source/drain contact of the logic transistor 902. The memory region 910 includes a full metallization stack connecting the memory cells 920 to transistors 912 in the memory region 910, and a partial metallization stack connecting a source line to the transistors 912 in the memory region 910. The memory cells 920 are depicted as being fabricated in between the M4 layer and the M5 layer. Also included in integrated circuit is a plurality of ILD layers. Six ILD layers, identified as ILD0 through ILD5 are depicted in FIG. 13 as spanning the logic region 900 and the memory region 910. The ILD layers may provide electrical insulation as well as structural support for the various features of the integrated circuit during many fabrication process steps.

As illustrated in FIG. 13, since a sidewall of the resistance switching element 924 is covered by the spacer 930, the M5 layer can be separated from the resistance switching element 924 at least by the spacer 930. As a result, a deposition process window of the M5 layer can be improved.

Embodiments of the present disclosure may have at least following advantages. The spacers are not removed by the etching back of the dielectric layer between the memory cells, and hence sidewalls of the resistance switching elements can be protected from the etching back process. Therefore, the damage risk on the resistance switching elements caused by the etching back can be prevented. Moreover, because the resistance switching elements can be still covered by the spacers after the etching back process, unwanted electrical connections from the later formed metal layer to the resistance switching elements can be prevented.

In accordance with some embodiments, a memory device includes a bottom electrode, a resistance switching element, a top electrode, a spacer and a conductive feature. The resistance switching element is over the bottom electrode. The top electrode is over the resistance switching electrode. The spacer abuts the resistance switching element. The conductive feature is over the top electrode. The spacer is at least partially between the conductive feature and the top electrode.

In accordance with some embodiments, an integrated circuit includes a substrate, a first memory cell, a first spacer and a first conductive feature. The first memory cell is over the substrate. The first memory cell includes a first bottom electrode, a first resistance switching element over the first bottom electrode, and a first top electrode over the first resistance switching element. The first spacer is on a sidewall of the first resistance switching element. The first conductive feature caps the first top electrode. A bottom of the first conductive feature is in a position lower than a top of the first spacer.

In accordance with some embodiments, a method of forming a memory device includes forming a memory cell over a substrate, the memory cell comprising a bottom electrode, a resistance switching element and a top electrode stacked in sequence, forming a spacer along sidewalls of the resistance switching element and the top electrode, forming a dielectric layer over the memory cell and the spacer, removing a portion of the dielectric layer until a sidewall of the spacer is exposed, and forming a conductive layer over a remaining portion of the dielectric layer and the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a bottom electrode;
   a first resistance switching element over the bottom electrode;
   a first top electrode over the first resistance switching element;
   a first spacer abutting the first resistance switching element;
   a first conductive feature over the first top electrode, wherein the first spacer is at least partially between the first conductive feature and the first top electrode; and
   a second resistance switching element separated from the bottom electrode;
   a second top electrode over the second resistance switching element a second conductive feature over the second top electrode; and
   a second spacer abutting the second resistance switching element, wherein a contact area between the first conductive feature and the first spacer is less than a contact area between the second conductive feature and the second spacer.

2. The memory device of claim 1, wherein the first spacer extends into a recess of the first conductive feature.

3. The memory device of claim 1, wherein the first top electrode and the first spacer fill a recess of the first conductive feature.

4. The memory device of claim 1, wherein the first top electrode and the first spacer are at least partially embedded in the first conductive feature.

5. The memory device of claim 1, wherein the first spacer has a sidewall abutting the first conductive feature.

6. The memory device of claim 1, further comprising:
   a dielectric feature abutting the first spacer, wherein a top surface of the dielectric feature is in a position lower than a top surface of the first spacer.

7. The memory device of claim 1, further comprising:
   a dielectric feature forming an interface with the first conductive feature, wherein the interface is in a position lower than a top surface of the first spacer.

8. The memory device of claim 1, further comprising:
   a dielectric feature underlying the first conductive feature, wherein the first spacer has a sidewall extending along the first conductive feature and the dielectric feature.

9. The memory device of claim 1, further comprising:
   a dielectric layer, wherein the first spacer protrudes from the dielectric layer, and the dielectric layer and the first spacer have different etch resistance properties.

10. The memory device of claim 1, further comprising: an interlayer dielectric layer having a first region and a second region raised above the first region, wherein the bottom electrode is on the first region.

11. An integrated circuit (IC), comprising:
a substrate;
a first memory cell over the substrate, the first memory cell comprising a first bottom electrode, a first resistance switching element over the first bottom electrode, and a first top electrode over the first resistance switching element;
a first spacer on a sidewall of the first resistance switching element;
a first conductive feature capping the first top electrode, wherein a bottom of the first conductive feature is in a position lower than a top of the first spacer;
a second memory cell over the substrate and comprising a second resistance switching element;
a dielectric layer between the first and second memory cells; and
a second spacer on a sidewall of the second resistance switching element, wherein a top of the second spacer and the top of the first spacer are higher than a top of the dielectric layer.

12. The IC of claim 10, wherein the second memory cell further comprises
a second bottom electrode under the second resistance switching element, and a second top electrode over the second resistance switching element, wherein the top of the second spacer and the top of the first spacer are at different heights.

13. The IC of claim 11, wherein the dielectric layer has an etch resistance property different from etch resistance properties of the first and second spacers.

14. The IC of claim 11, further comprising:
a second conductive feature capping the second memory cell, wherein a bottom of the second conductive feature is in a position lower than the top of the second spacer.

15. The IC of claim 14, wherein a distance between the bottom of the first conductive feature and the top of the first spacer is different from a distance between the bottom of the second conductive feature and the top of the second spacer.

16. The IC of claim 14, wherein the first and second spacers respectively extend into recesses of the first and second conductive features.

17. An integrated circuit (IC), comprising:
first and second memory cells over a substrate, the first memory cell comprising first bottom and top electrodes and a first resisting switching element interposed between the first bottom and top electrodes, the second memory cell comprising second bottom and top electrodes and a second resisting switching element interposed between the second bottom and top electrodes;
first and second conductive features extending across the first and second memory cell, respectively; and
first and second spacers alongside the first and second top electrodes, respectively, wherein an interface between the first conductive feature and a sidewall of the first spacer is shorter than an interface between the second conductive feature and a sidewall of the second spacer.

18. The IC of claim 17, wherein the first spacer has a top in a lower position than a top of the second spacer.

19. The IC of claim 17, wherein the first bottom electrode has a bottom in a lower position than a bottom of the second bottom electrode.

20. The IC of claim 17, further comprising:
a dielectric layer in between the first and second memory cells, the dielectric layer has a stepped bottom surface.

* * * * *